United States Patent [19]
Kunimoto et al.

[11] Patent Number: 5,382,797
[45] Date of Patent: Jan. 17, 1995

[54] FAST COOLDOWN CRYOSTAT FOR LARGE INFRARED FOCAL PLANE ARRAYS

[75] Inventors: Wallace Y. Kunimoto; Arthur A. Eneim, both of Goleta, Calif.

[73] Assignee: Santa Barbara Research Center, Goleta, Calif.

[21] Appl. No.: 632,196

[22] Filed: Dec. 21, 1990

[51] Int. Cl.⁶ .................................. G01J 5/06
[52] U.S. Cl. .................................. 250/352
[58] Field of Search ........................... 250/352

[56] References Cited

U.S. PATENT DOCUMENTS

| | | | |
|---|---|---|---|
| 4,954,708 | 9/1990 | Salzer et al. | 250/352 |
| 5,077,979 | 1/1992 | Skertic et al. | 250/352 X |

*Primary Examiner*—Mark Hellner
*Attorney, Agent, or Firm*—W. C. Schubert; W. K. Denson-Low

[57] ABSTRACT

A dual Joule-Thompson cryostat assembly (10) is provided which includes first and second concentrically aligned cryostats (100) and (102), respectively, which are disposed in the coldwell of a detector assembly (12). Each of the cryostats is connected to a source of pressurized gas which is discharged into the coldwell. The pressurized gas is directed at the components to be cooled such that the relatively high discharge velocity produces a relatively high film coefficient for maximizing heat transfer. Both the inner and outer cryostats, (100) and (102), respectively, of the dual cryostat assembly (10) are designed to direct pressurized gas at an electromagnetic detector (26). In addition, the inner cryostat (100) directs pressurized gas toward the outer cryostat (102) for precooling the outer cryostat (102). Furthermore, the outer cryostat (102) is designed to direct pressurized gas for cooling a coldshield (50) surrounding the detector (26).

23 Claims, 2 Drawing Sheets

FAST COOLDOWN CRYOSTAT FOR LARGE INFRARED FOCAL PLANE ARRAYS

BACKGROUND OF THE INVENTION

1. Field of the Invention

This invention relates to an improved infrared detector assembly, and more particularly to one having an improved cryostat for generating fast cooldown of large infrared focal plane arrays.

2. Discussion

Infrared detection systems are often used in conjunction with munitions and night vision systems for sensing electro-magnetic radiation in the wavelength range of 4 to 16 micrometers. Because many such detection systems have infrared detector arrays, commonly referred to as focal plane arrays (FPA's), which are generally most sensitive when operated at cryogenic temperatures, a cooling system is required to produce and maintain the cryogenic operating temperatures. Furthermore, fluctuations in the temperature directly impact the sensitivity of the detectors and can result in undesirable electronic instability and electronic noise. Therefore, it is desirable to maintain the cooled detector at a constant temperature to eliminate the instability and noise during operation of the detection system.

Commonly, cryogenic cooling systems either take the form of a Joule-Thompson cryostat utilizing the conversion of pressurized gases to cryogenic liquids or a Stirling cryoengine with closed-cycle refrigeration. The cooling systems are used in conjunction with a vacuum insulated dewar in which the electromagnetic detector array is placed. The dewar is evacuated to remove thermally conductive gases which would otherwise occupy the area surrounding the detector array so that potential heat loss through convection and conduction is minimized. Furthermore, the evacuated dewar also prevents moisture from condensing on the detector array.

The dewar is cooled by placing an indented region ("coldwell") of the dewar in contact with an expansion chamber ("expander") of the cryogenic cooling system. Commonly, the expander has a cylindrical tube ("cold finger") having a cold end which supports a focal plane platform or "heat sink" upon which the detector array and related components are mounted. Alternately, the dewar can be constructed without a cold finger such that the detector array is mechanically supported directly by the focal plane platform. In either case, thermal energy is withdrawn from the detector array through the heat sink which is in thermally conductive communication with the cryogenic cooling system.

Since the cryogenic cooling system is in thermal communication with the heat sink, expansion of a high pressure gas (i.e. argon, nitrogen) within the coldwell causes thermal energy to be withdrawn from the detector array for permitting the electronic components to operate at their most effective temperature. In addition, it is desirable to simultaneously cool the coldshield, which surrounds the detector array, to reduce electronic noise and to improve the background scene.

In order to produce efficient conductive withdrawal of thermal energy from the electromagnetic detector array and the coldshield, the focal plane platform on which they are mounted must be fabricated from a material, or composition of materials, possessing specific metallurgical properties. Ideally these properties include high strength, a high modulus of elasticity and high thermal conductivity. Additionally, the focal plane platform must provide low thermal distortion characteristics to minimize premature detector failure.

A number of design constraints affect the design of the focal plane platform. Since the focal plane platform is a structural support member, it must have sufficient bending stiffness to minimize mechanical deflection of the electromagnetic detector. Such requirements become particularly significant when the infrared seeker assembly is used as part of munition system which is subjected to intense vibration and high levels of boost-phase acceleration. Another significant design parameter is the extent to which heat is transferred through the focal plane platform. More particularly, it is critical that the cooldown rate for the cold end components of the infrared detector assembly, mounted to the focal plane platform, be less than a predetermined maximum time requirement. Since infrared seekers are often used in expendable munitions which must identify a target soon after (or before) their launch, cooldown time is a primary design parameter.

In most modern applications, the use of large staring type hybridized focal plane arrays (FPA's) has necessitated the utilization of focal plane platforms or heat sinks having increased thickness. The thicker platforms promote superior hybrid reliability and reduces thermal fatigue related detector failures. Unfortunately, the utilization of a thicker focal plane platform increases the Joule load of the system which proportionately increases the cryostat cooling requirements. Currently, infrared detection systems using large area FPAs, silicon read-out chips, and larger coldshields are capable of producing a minimum cooldown time of about 10 to 12 seconds when equipped with a conventional Joule-Thompson cryostat. However, in most modern munitions applications, a cooldown time of about 5 seconds is specified as the maximum acceptable time requirement.

SUMMARY OF THE INVENTION

In accordance with the foregoing, it is an object of the present invention to provide an improved cryostat assembly featuring faster cooldown time capability for cooling relatively large area detector arrays. In accordance with this invention, a dual Joule-Thompson cryostat assembly is provided which includes two concentrically aligned cryostats disposed in the coldwell of a detector assembly. Each of the cryostats is connected to a source of pressurized gas which is discharged into the coldwell. The pressurized gas is directed at the components to be cooled such that the relatively high discharge velocity produces a relatively high film coefficient for maximizing heat transfer. Both the inner and outer cryostats of the dual cryostat assembly are designed to direct pressurized gas at an electromagnetic detector. In addition, the inner cryostat directs pressurized gas toward the outer cryostat for precooling the outer cryostat. Furthermore, the outer cryostat is designed to direct pressurized gas for cooling a coldshield surrounding the detector.

Additional benefits and advantages of the present invention will become apparent to one skilled in the art upon reading the subsequent specification and appended claims, taken in conjunction with the accompanying drawings.

DETAILED DESCRIPTION OF THE PREFERRED EMBODIMENTS

The cooling capacity of conventional Joule-Thompson cryostat cooling systems is directly related to the Joule load of the detector/dewars which must be cooled and the maximum acceptable cooldown time requirement. Currently, the technical requirements for infrared detection systems include the ability to simultaneously cool large area detector arrays (FPA's) to at least about 80° Kelvin and its surrounding coldshield to at least about 200° Kelvin, in less than 10 seconds. More particularly, the technical requirements for munitions applications specify cooling of the FPA's and coldshield to operating temperatures of 77° Kelvin and 150° Kelvin, respectively, in about 5 seconds. As mentioned, conventional Joule-Thompson cryostats are currently only capable of cooling such hybrid detector arrays and coldshields to their specified cryogenic operating temperatures in a minimum time of at least about 10 to 12 seconds. In addition, the increased thickness of the heat sink generates an additional Joule load requirement which must be accounted for in developing a cooling system capable of providing the desired fast cooldown rate.

While it is known to use a dual cryostat assembly comprised of an inner cryostat and an outer cryostat, heretobefore the inner cryostat has been used primarily for precooling the outer cryostat. A relatively small portion of the refrigeration capacity of the inner cryostat is conductively coupled to the FPA's through the end-cap of the outer cryostat. Refrigeration for cooling the heat sink, the coldshield, and the focal plane array (FPA) has, up until now, been primarily provided by the outer cryostat.

Figure 1:
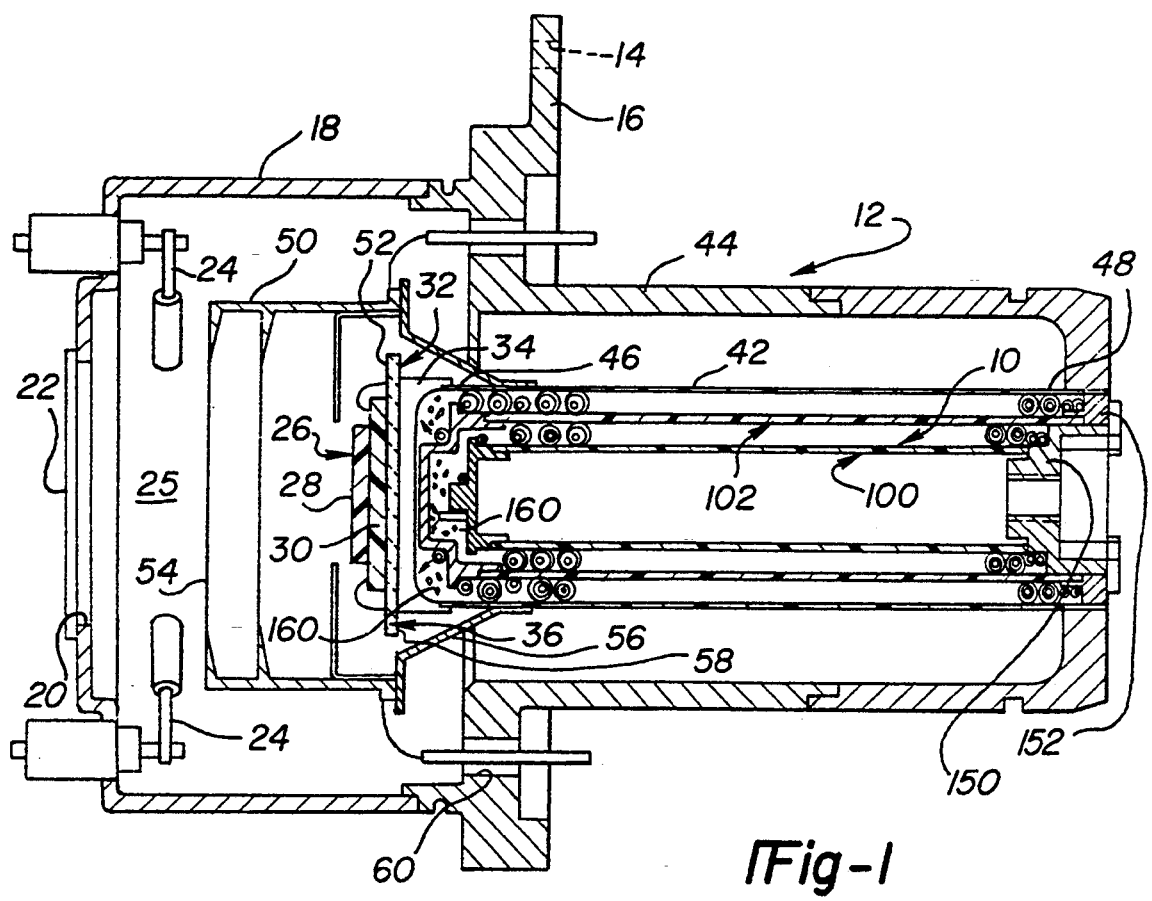
FIG. 1 is a longitudinal cross-sectional view of an infrared seeker assembly equipped with an improved fast cooldown cryostat assembly illustrating the operational association of the various components.
Figure 2:
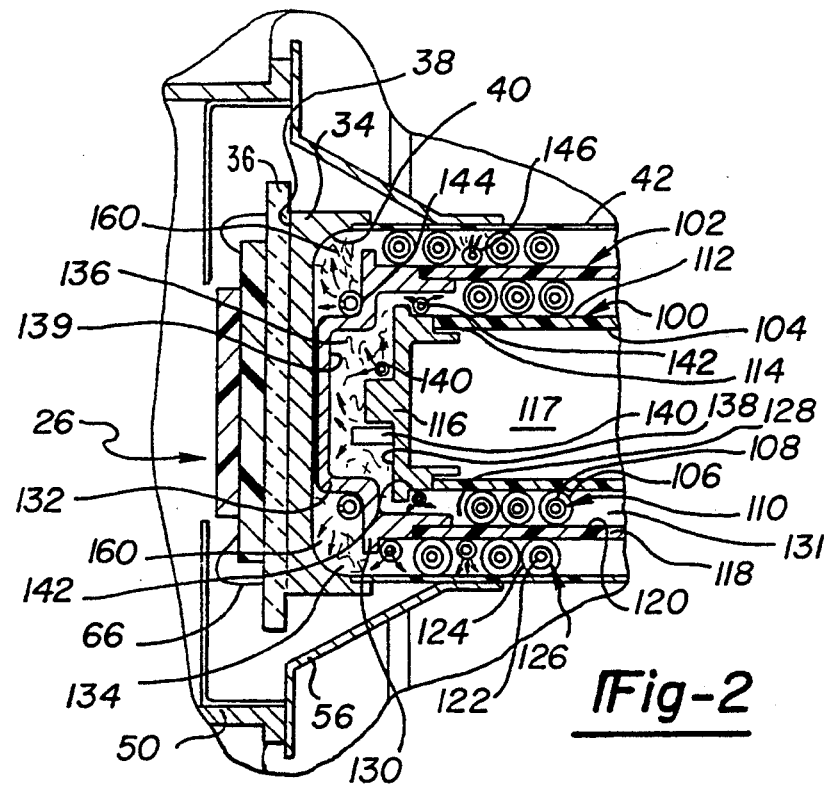
FIG. 2 is an enlarged view of the cold end of the improved cryostat assembly shown in FIG. 1.

In reference to the drawings, a fast cooldown cryostat assembly 10 according to an exemplary embodiment of the present invention is shown. FIG. 1 illustrates a detector assembly 12, such as an infrared seeker assembly, having fast cooldown cryostat assembly 10 operatively installed therein. Detector assembly 12 is secured to a mounting structure by a plurality of fasteners (not shown) which extend through bores 14 on mounting flange 16. Dewar housing 18 encloses the forward end of detector assembly 12 and has a central aperture 20 covered by infrared window 22. Window 22 is preferably fabricated from germanium or zinc senenide to produce the desired transmission band, and is used to transmit incoming infrared radiation to the detector. Getters 24 are provided to absorb any outgassing which escapes into the interior cavity 25 within dewar housing 18.

Detector assembly 12 includes a detector device 26 for receiving infrared radiation and generating responsive electrical signals. Preferably, detector 26 includes a photodetector focal plane array 28 which is electrically interconnected to an integrated circuit read-out board 30. The hybrid detector 26 is secured to a "heat sink" or focal plane platform 32 by a thermally conductive adhesive, which permits thermal energy to flow from detector 26. Preferably, the adhesive compound is of a silicon based, room temperature, vulcanizing type having a low glass transition temperature to inhibit thermal stresses. Focal plane platform 32 is a low distortion member adapted for maintaining surface flatness during cryogenic cooling condition to promote hybrid reliability. An exemplary disclosure of an improved focal plane platform 32 capable of promoting superior hybrid reliability is disclosed in U.S. application Ser. No. 07/397,808, filed Aug. 23, 1989, for LOW DISTORTION FOCAL PLANE PLATFORM, which is assigned to the common assignee of the present invention, the entire disclosure of which is expressly incorporated by reference hereto. As such, focal plane platform 32 provides a relatively stress-free support structure upon which detector 26 is mounted. However, it will be appreciated that the structure of the focal plane platform is recited as merely exemplary in nature and is not to be interpreted to limit the scope of the present invention.

Focal plane platform 32 includes an end-cap member 34 and a low distortion mounting board 36, commonly referred to as the "motherboard". End-cap 34 is disc-shaped and has a relatively low thermal mass while having relatively high thermal conductivity. End-cap 34 has a first and second surface 38 and 40, respectively. First surface 38 is substantially planar. In accordance with the exemplary embodiment shown, second surface 40 is configured to enclose and hermetically seal a cold finger tube 42 so as to define an "expansion" chamber within cryostat assembly 10. Cold finger tube 42 is axially disposed within a lower dewar housing assembly 44. Preferably, cold finger tube 42 is a relatively thin-walled right circular tubular member which has a cold end 46 and a warm end 48 (referring to their respective temperatures during use). Cold end 46 is enclosed by second surface 40 of end-cap 34. A thermally stable hermetic seal is provided between the interface of the cold end 46 of cold finger tube 42 and second surface 40 of end-cap 34. Furthermore, since cold finger tube 42 is a cantilever supported member, it must have sufficient bending stiffness to control deflection of focal plane platform 32 and, in turn, detector 26.

Mounting board 36 has a disc-shaped configuration having a larger cross-sectional area than end-cap 34. Preferably, mounting board 36 is fabricated from a material, such as ceramic, so as to provide a relatively stress-free platform upon which detector 26 is mounted. Mounting board 36 is secured to first surface 38 of end-cap 34 by means of a thermally conductive adhesive.

To withdraw thermal energy from detector 26 for producing optimum detector performance, fast cooldown cryostat assembly 10 is axially disposed and secured within the "expansion" chamber of cold finger tube 42. Cold finger tube 42 houses the refrigeration mechanism (cryostat assembly 10) for cooling detector 26 through the process of heat transfer from detector 26 to the cryogenic fluid. As is known in the art, Joule-Thompson cryostats use a high pressure gas which is discharged into the cold end of the expansion chamber of the cryostat. Thereafter, the gas expands and liquifies for withdrawing heat from the detector. The liquified gas then boils-off or "vaporizes" for use in completing the heat transfer cycle. It is contemplated that any high pressure gas (i.e. argon, nitrogen, helium), or combinations thereof, used in Joule-Thompson cryostat cooling systems and which generates the desired cooling characteristics is suitable for use with the present invention. Expansion of the gas within the cold end 46 of cold finger tube 42, causes thermal energy to be withdrawn from focal plane platform 32 thereby cooling detector 26.

To minimize the amount of thermal radiation delivered to detector 26 from sources other than the scene, a cold shield 50 is provided which is generally centrally located over detector 26. Coldshield 50 is adhesively secured to forward surface 52 of mounting board 36 so as to be radially outward of and in coaxial relation to detector 26. Coldshield 50 has an aperture 54 which provides an unobstructed path for infrared radiation from the environment to be received by detector 26. Coldshield 50 is supported and adapted to receive thermally conductive heat transfer from an off-mounted conical support member 56 secured between an outer peripheral wall surface of cold finger tube 42 and a rearward surface 58 of mounting board 36. Coldshield 50 has a thin wall structure and is fabricated from a relatively high thermally conductive material. Preferably, coldshield 50 has a relatively low thermal mass for reducing its required cooldown time. Most modern infrared seeker applications require that coldshield 50 be cooled to at least about 200° K. simultaneously with the cooling of detector 26 to about 80° K. More particularly, it is desirable to fabricate coldshield 50 from a material which may be cooled to a temperature of at least about 150° K. in about 5° seconds. While coldshield 50 may be fabricated from 6061-T6 aluminum, it is to be understood that other suitable materials may be used. Faster cooling of coldshield 50 tends to reduce electronic noise and improve the background scene for promoting increased detector sensitivity.

Figure 3:
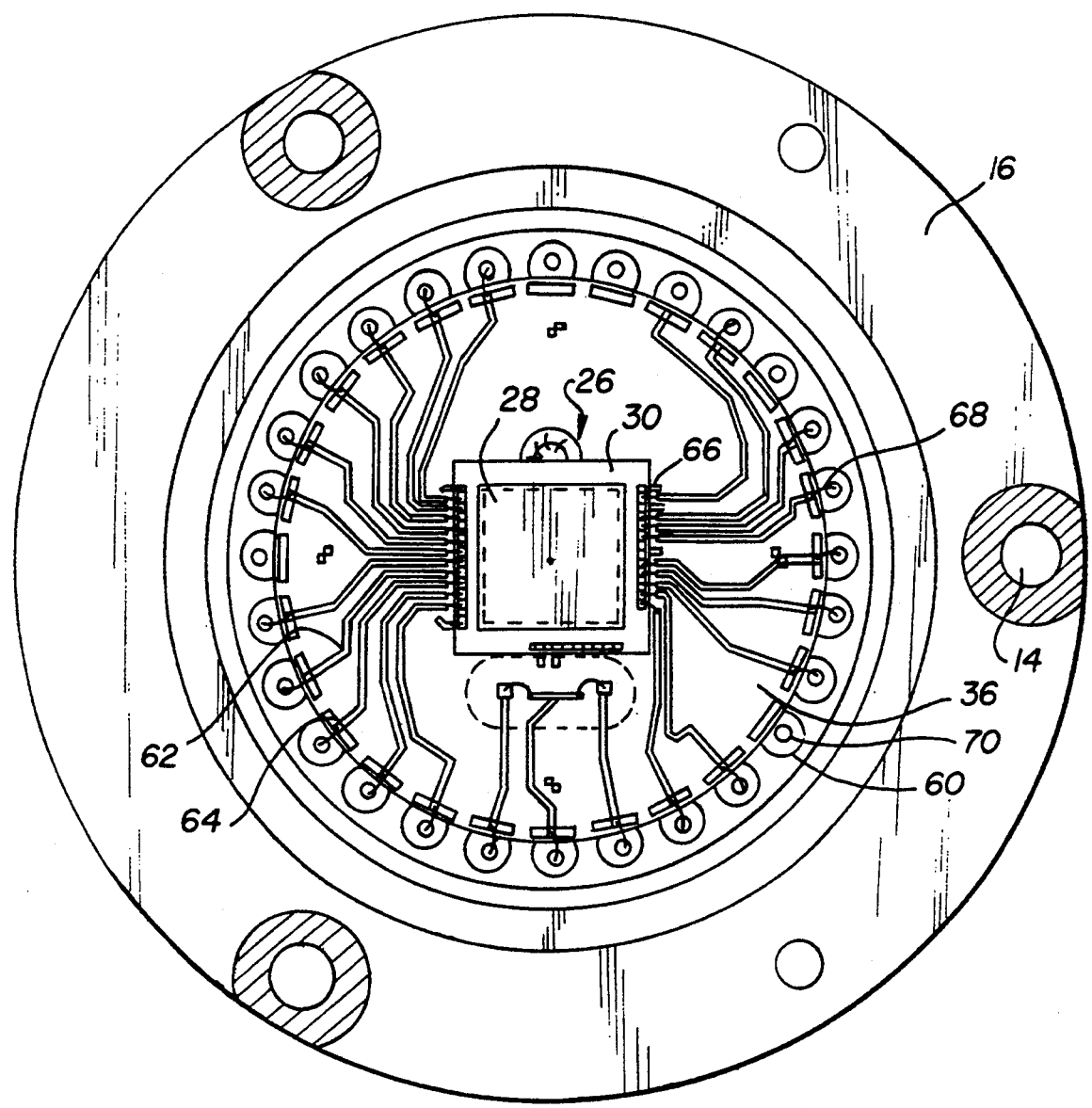
FIG. 3 is a top view of FIG. 1 with the dewar housing and coldshield removed for illustrating the electrical interconnection of the components.

To permit electrical communication between detector 26 and external electronics, wiring associated with detector 26 penetrates mounting flange 16 at feedthrough ports 60. Referring now to FIG. 3, the means for conducting electrical signals from detector 26 to feed-through ports 60 is illustrated in greater detail. Generally, the planar surface upon which infrared detector 26 is mounted is "metalized" to provide an electrically conductive communication path. Specifically, a predefined pattern having a plurality of gold traces 62 is vapor deposited on forward surface 52 of mounting board 36 prior to mounting detector 26 thereon. Gold traces 62 emanate radially from a location relatively near detector 26 to a plurality of positions near the peripheral circumference of mounting board 36. More particularly, gold trace pattern 62 begins at about a ⅛" distance from two opposite edges of integrated circuit readout board 30 and culminates at a plurality of conductive pads 64 located along the outer circumference of mounting board 36. Gold traces 62 are attached at one end to integrated circuit readout board 30 via lead wires 66. Lead wires 66 are attached via wire bonding to provide an electrical conduction path which is resistant to thermal and mechanical distortion and oscillation during cryogenic operation. Conductive pads 64 are also wire bonded via lead wires 68 to feed-through pins 70 extending through feed-through ports 60. In this manner, the electrical signals generated by detector 26 which are delivered to external control electronics (not shown) tend to minimize premature detector fatigue failure.

In accordance with the present invention, fast cooldown cryostat assembly 10 is a dual Joule-Thompson cryostat assembly which includes an inner cryostat 100 and an outer cryostat 102. Inner cryostat 100 is coaxially disposed within outer cryostat 102 which, in turn, is coaxially disposed within cold finger tube 42. Inner cryostat 100 includes a first elongated tubular mandrel 104 which is a rigid structural member made from a material possessing relatively low thermal conductivity characteristics. The utilization of a material having low thermal conductivity slows the cooling rate of first mandrel 104 such that more refrigeration is directed to the components to be cooled. Inner cryostat 100 further includes tubing 106 carrying radially extending fins 108 thereon to form first finned tube assembly 110. First finned tube assembly 110 is spirally wrapped around the outer peripheral wall surface 112 of first mandrel 104. First finned tube assembly 110 is in fluid communication with a remote source (not shown) of a high pressure gas so as to define a first heat exchanger circuit. The first heat exchanger circuit is adapted to continuously supply the high pressure gas to a plurality of terminal outlet orifices, the orientation and function of which will be defined hereinafter in greater detail. The cold end 114 of first mandrel 104 is enclosed by a first cryostat endcap 116. Preferably, cold end 114 of first mandrel 104 is bonded to first cryostat end-cap 116 to define a first elongated hermetic chamber 117. In addition, first cryostat end-cap 116 is fabricated from a material having relatively high thermal conductivity.

Outer cryostat 102 includes a second elongated tubular mandrel 118 which has an inner cylindrical wall surface 120 sized for tangentially engaging the radially outermost portion of fins 108 of first finned tube assembly 110. Again, second mandrel 118 is fabricated from a material having a relatively low thermal conductivity for the same reasons as set forth in the description of first mandrel 104. Outer cryostat 102 also includes tubing 122 carrying radial fins 124 thereon. Tubing 122 is spirally wrapped on the outer peripheral wall surface of second mandrel 118 to form second finned tube assembly 126. An insulative thread, such as nylon, is tightly wrapped around second finned tube assembly 126 for thermally isolating fins 124 from direct contact with cold finger tube 42. Second finned tube assembly 126 is in fluid communication with a second remote source (not shown) of high pressure gas for defining a second heat exchanger circuit. Second finned tube assembly 126 includes a plurality of outlet orifices, to be detailed hereinafter, which are oriented to maximize the withdrawal of heat from detector 26 and coldshield 50.

At cold end 128 of outer cryostat 102, there is provided a second cryostat end-cap 130. Preferably, second cryostat end-cap 130 is fabricated from a material have relatively high thermal conductivity for maximizing the heat transfer characteristics of cryostat assembly 10. Exemplary materials of choice for second cryostat endcap 130 are copper or tungsten. Second mandrel 118 is hermetically bonded to second cryostat end-cap 130 to define a second elongated hermetic chamber 131 within which inner cryostat 100 is operatively disposed. Preferably, a portion of forward surface 132 of second cryostat end-cap 130 is adhesively bonded by a thermally conductive adhesive to lower surface 40 of end-cap 34. Such a thermally conductive adhesive permits thermal energy to efficiently flow directly from detector 26 through focal plane platform 32 to fast cooldown cryostat assembly 10 for efficiently cooling of detector 26 and coldshield 44. In particular, forward surface 132 of second cryostat end-cap 130 is stepped to provide a central raised portion which is adhesively bonded to end-cap 34 of focal plane platform 32. The outer peripheral portion of forward surface 132 of second cryostat end-cap 130, which surrounds the central raised portion thereof, is configured to define a first annular space 134 between second cryostat end-cap 130 and second surface 40 of focal plane platform end-cap 34 at cold end 46 of the expansion chamber. Similarly, a second annular space 136 is provided between a forward surface 138 of first cryostat end-cap 116 and a rearward surface 139 of second cryostat end-cap 130 at cold end 128 of outer cryostat 102.

First finned tube assembly 110 of inner cryostat 100 terminates in at least one longitudinally directed outlet orifice 140 for discharging the high pressure gas flowing therethrough toward rearward surface 139 of the central raised portion of second cryostat end-cap 130. In this manner, expansion of the gas discharged within second annular space 136 is directed toward second cryostat end-cap 130 which is in direct mating contact with focal plane platform 32. Therefore, inner cryostat 100 is adapted to provide direct cooling to focal plane platform 32. In addition, first finned tube assembly 110 of inner cryostat 100 includes a plurality of radially directed outlet orifices 142 located along the outer peripheral wall of first mandrel 104 and in close proximity to cold end 128 of outer cryostat 102. In this manner, the radially directed outlet orifices 142 are aimed at second cryostat end-cap 130 for "precooling" cold end 128 of outer cryostat 102. Outlet orifices 142 are oriented to generate a relatively high film coefficient due to the high discharge velocity of the gas discharged therefrom.

Second finned tube assembly 126 of outer cryostat 102 terminates in a plurality of longitudinally directed outlet orifices 144 which generally surround the central raised portion of second cryostat end-cap 130. Outlet orifices 144 are provided within first annular space 134 for directly cooling focal plane platform 32. In addition, second finned tube assembly 126 includes a plurality of radially directed outlet orifices 146 located around the outer peripheral surface of second mandrel 118 and in close proximity to cold end 46 of coldfinger tube 42. More particularly, radially directed outlet orifices 146 are located proximate to off-mounted conical support member 56 and are adapted to directly cool off-mounted conical support 56 for conductively cooling coldshield 50. The high discharge velocity of the high pressure gas exiting outlet orifices 146 generates a high film coefficient for maximizing heat transfer from coldshield 50 through conical support member 56. In this manner, faster cooling of coldshield 50 is achieved by orienting radially directed orifices 146 toward conical support member 56.

As is apparent, both the first and second heat exchanger circuits discharge high pressure gas toward focal plane platform 32 for cooling detector 26. Spacer cap member 150 and ring 152 are associated with warm end 42 of fast cooldown cryostat assembly 10 for providing and maintaining the relative positioning between inner cryostat 100 and outer cryostat 102 as well as annular spaces 134 and 136. As shown, an absorptive material, such as felt 160 is packed within the annular spaces 134 and 136. Felt 160 holds the liquid cryogen, following expansion of the gas, adjacent the respective cryostat end-caps 116 and 130 and the platform end-cap 34 such that the liquid cryogen vaporizes within felt 160 to produce a relatively stable refrigeration environment. The use of felt 160 decreases the range of temperature fluctuation and, therefore, the rate of change of temperature at detector 26. Furthermore, the use of felt 160 results in a decrease in vapor pressure in the region to be cooled by retaining the liquid cryogen in close proximity to detector 26 and focal plane platform 32 where the greatest cooling capacity is most needed. As such, the high pressure gas is directed for expansion where the greatest cryogenic cooling capacity is required. In this manner, faster cryogenic cooling is produced over a relatively large surface area by the high pressure gas being discharged at structural locations within the expansion chamber that need to be most efficiently cooled. After the cryogens leave the region in which useful refrigeration is produced, it moves rearwardly through fins 108 and 124 of the respective inner and outer cryostats in counterflow heat exchange relationship to the incoming high pressure gas in tubing 106 and 122.

The present invention employs a dual Joule-Thompson fast cooldown cryostat assembly 10 for cooling high Joule load detectors and dewar assemblies to a desired cryogenic temperature within a substantially reduced cooldown time as compared to conventional cryostat assemblies. In this manner, more efficient cryogenic cooling of focal plane platform 32 and consequently, detector 26 is generated. In addition coldshield 50 will cool much faster than that previously known because the high discharge velocity of the gas exiting the peripheral orifices of the outer cryostat 102 creates a relatively high film coefficient for directly cooling support member 56.

It is contemplated that as an alternative embodiment, the second cryostat end-cap 130 of outer cryostat 102 can be adapted to provide an aperture extending through to the second surface 42 of end-cap 34. In this manner, cryogenic cooling within second annular space 136 and generated by inner cryostat 100 is in direct thermal communication with focal plane platform 32.

Those skilled in the art can appreciate that other advantages can be obtained from the use of the invention and that modifications can be made without departing from the true spirit of the invention after studying the specification, drawings and the following claims.

What is claimed is:

1. A cryostat apparatus for use in a detector assembly of the type having an evacuated dewar for simultaneously cooling a detector and a coldshield supported on a focal platform, the focal plane being in thermal communication with a cold end portion of a cold finger tube for defining an expansion chamber within the detector assembly, comprising:

an outer cryostat axially disposed with the cold finger tube, said outer cryostat having a first tubular mandrel and a first end-cap configured to enclose said first mandrel, said first end cup having a raised central portion positioned so that there is provided a relatively high thermal conductivity path to said cold end portion;

a first supply tube wrapped around an outer peripheral wall surface of said first mandrel for supplying a pressurized cryogen for cooling a first region located adjacent the focal platform and proximate the cold end of the cold finger tube around said raised central portion of said first end cap;

first orifice means associated with said first supply tube for discharging said pressurized cryogen within said first region for cooling the focal platform and the detector;

second orifice means associated with said first supply tube for discharging said pressurized cryogen for cooling the coldshield;

an inner cryostat axially disposed within said first mandrel, said inner cryostat having a second tubular mandrel and a second end-cap configured to enclose said second mandrel, said second end-cap displaced from said first end-cap to define a second region to be cooled;

a second supply tube wrapped around an outer peripheral wall surface of said second mandrel for supplying a pressurized cryogen to said second region to be cooled;

third orifice means associated with said second supply tube for discharging said pressurized cryogen within said second region for cooling the focal platform and the detector; and fourth orifice means associated with said second supply tube for discharging said pressurized cryogen for cooling said outer cryostat.

2. The cryostat apparatus according to claim 1 further comprising a support member secured between the cold end of the cold finger tube and the focal platform, said support member fabricated from a relatively high thermally conductive material and positioned in close proximity to the coldshield for providing a relatively high thermal conductivity path between said cryostat apparatus and the coldshield.

3. The cryostat apparatus according to claim 1 wherein said first and second mandrels are made of a relatively low thermal conductivity material and said first and second end-caps are made of a relatively high thermal conductivity material.

4. The cryostat apparatus according to claim 2 wherein said first supply tube has first fins thereon such that cryogen flowing away from the cold end of the cold finger from said first region passes over said first fins to cool said pressurized cryogen flowing within said first supply tube toward said first and second orifice means, and wherein said second supply tube has second fins thereon such that cryogen flowing away from said first end-cap within said second region passes over said second fins to cool said pressurized cryogen flowing within said second supply tube toward said third and fourth orifice means.

5. The cryostat apparatus according to claim 4 wherein said first and second regions to be cooled form first and second annular spaces, respectively, said first and second annular spaces having an absorptive material disposed therein, said absorptive material having a relatively low thermal mass for promoting relatively constant cooling during expansion of said pressurized cryogen with said first and second annular spaces.

6. The cryostat apparatus according to claim 5 wherein said first orifice means include a first outlet orifice extending through said first supply tube which is oriented for discharging pressurized cryogen into said first annular space to directly cool the focal platform for withdrawing heat from said detector.

7. The cryostat apparatus according to claim 6 wherein said second orifice means includes a second outlet orifice extending through said first supply tube which is located along the periphery of said first mandrel and oriented for directly cooling said support member so as to reduce the cooldown time for cooling the coldshield to a desired cryogenic temperature.

8. The cryostat apparatus according to claim 7 wherein said third orifice means includes a third outlet orifice through said second supply tube which is oriented for discharging pressurized cryogen into said second annular space for cooling said first end-cap, a portion of said first end-cap being configured to be contiguous to the focal platform such that said third outlet orifice directly cools the focal platform for withdrawing heat from the detector.

9. The cryostat apparatus according to claim 8 wherein said fourth orifice means includes a fourth outlet orifice extending through said second supply tube located along the periphery of said second mandrel and oriented for precooling said outer cryostat.

10. The cryostat apparatus according to claim 9 which is operative to simultaneously cool the detector to at least about 80° K. and the coldshield to at least about 200° K. in a time period of less than about 10 seconds.

11. A detector assembly comprising:
a dewar housing forming an evacuated cavity;
a focal plane platform within said evacuated cavity;
a detector mounted on a first surface of said focal plane platform;
a coldshield concentrically surrounding said detector and mounted on said first surface of said focal plane platform;
a cold finger tube having one terminal end hermetically sealed to a second surface of said focal plane platform for defining a cold end thereof;
a thermally conductive support member for providing a relatively high thermally conductive flow path between said cold end and said coldshield; and
cooling means for simultaneously cooling said detector and said coldshield to their respective cryogenic temperatures within a predetermined time requirement, said cooling means including an inner cryostat and an outer cryostat coaxially disposed with said cold finger tube;
said inner cryostat having first supply means for delivering a pressurized cryogen to said cold end of said cold finger tube and first orifice means oriented for discharging said pressurized cryogen so as to cool said focal plane platform and said detector while concurrently acting to precool said outer cryostat;
said outer cryostat having second supply means for delivering a pressurized cryogen to said cold end of said cold finger tube and second orifice means oriented for discharging said pressurized cryogen to cool said focal plane platform and said detector while concurrently cooling said support member for cooling said coldshield.

12. The detector assembly according to claim 11 wherein said thermally conductive support member is secured between an outer surface of said cold finger tube and said second surface of said focal plane platform such that said support member is in close proximity to said coldshield.

13. The detector assembly according to claim 11 wherein said inner cryostat includes a first tubular mandrel and a first end-cap member enclosing a terminal end of said first mandrel located proximate said cold end of said cold finger tube, said first mandrel being made from a relatively low thermal conductivity material, and said first end-cap being made from a relatively high thermal conductivity material.

14. The detector assembly according to claim 13 wherein said first supply means includes a first finned supply tube which is spirally wrapped around an outer peripheral wall surface of said first mandrel, said first finned supply tube coaxially disposed within said outer cryostat so that cryogen flowing in a counter-flow direction away from said cold end engages the fins of said first finned supply tube to cool pressurized cryogen flowing therein.

15. The detector assembly according to claim 14 wherein said outer cryostat includes a second tubular mandrel and a second end-cap member enclosing a terminal end of said second mandrel located proximate said cold end of said cold finger tube, said second mandrel made from a relatively low thermal conductivity material, said first end-cap made from a relatively high thermal conductivity material, and wherein said second end-cap is configured to have a raised portion in abutting engagement with said focal plane platform.

16. The detector assembly according to claim 15 wherein said second supply means includes a second finned supply tube which is spirally wrapped around an outer peripheral wall surface of said second mandrel, said second finned supply tube coaxially disposed within said cold finger tube so that cryogen flowing in a counter-flow direction away from said cold end engages the fins of said second finned supply tube to cool pressurized cryogen flowing therein.

17. The detector assembly according to claim 16 wherein said first orifice means includes at least one longitudinally directed outlet orifice extending through said first finned supply tube and oriented for discharging high velocity cryogen toward a first region to be cooled, said first region located adjacent said raised portion of said second end-cap, said first orifice means also including a plurality of radially outwardly directed outlet orifices extending through said first finned supply tube which are oriented for discharging high velocity cryogen toward said second end-cap for precooling said outer cryostat.

18. The detector assembly according to claim 17 wherein said second orifice means includes at least one longitudinally directed outlet orifice extending through said second finned supply tube which is oriented so as to discharge high velocity cryogen therethrough toward a second region to be cooled, said second region located between said second end-cap and said second surface of said cold finger tube, said second orifice means also including a plurality of radially outwardly directed outlet orifices extending through said second finned supply tube for discharging high velocity cryogen toward said cold finger tube for cooling said support member and said coldshield.

19. The detector assembly according to claim 18 wherein said raised portion of said second end-cap is adhesively bonded to said second surface of said focal plane platform.

20. The detector assembly according to claim 19 wherein said second region to be cooled is located between said focal plane platform and said second end-cap of said outer cryostat so as to form a first annular space, and wherein said first region to be cooled between said second end-cap and said first end-cap forms a second annular space, said first and second annular spaces being packed with an absorptive material.

21. The detector assembly according to claim 20 wherein said absorptive material is felt.

22. The detector assembly according to claim 21 which is operative to simultaneously cool the detector to at least about 80° K. and the coldshield to at least about 200° K. in a time period of less than about 10 seconds.

23. The detector assembly according to claim 11 wherein said detector comprises an infrared photodetector array electrically interconnected to an integrated circuit readout board, said integrated circuit readout board generating an electrical output in response to said array, and said readout board mounted to said focal plane platform.

* * * * *